US011810770B2

(12) United States Patent
Wang et al.

(10) Patent No.: US 11,810,770 B2
(45) Date of Patent: *Nov. 7, 2023

(54) METHODS AND APPARATUS FOR CONTROLLING ION FRACTION IN PHYSICAL VAPOR DEPOSITION PROCESSES

(71) Applicant: APPLIED MATERIALS, INC., Santa Clara, CA (US)

(72) Inventors: Xiaodong Wang, San Jose, CA (US); Joung Joo Lee, San Jose, CA (US); Fuhong Zhang, Cupertino, CA (US); Martin Lee Riker, Milpitas, CA (US); Keith A. Miller, Mountain View, CA (US); William Fruchterman, Santa Clara, CA (US); Rongjun Wang, Dublin, CA (US); Adolph Miller Allen, Oakland, CA (US); Shouyin Zhang, Livermore, CA (US); Xianmin Tang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/490,840

(22) Filed: Sep. 30, 2021

(65) Prior Publication Data
US 2022/0020577 A1 Jan. 20, 2022

Related U.S. Application Data

(63) Continuation of application No. 17/101,933, filed on Nov. 23, 2020, now abandoned, which is a
(Continued)

(51) Int. Cl.
*H01J 37/34* (2006.01)
*C23C 14/35* (2006.01)
(Continued)

(52) U.S. Cl.
CPC ........ *H01J 37/3458* (2013.01); *C23C 14/345* (2013.01); *C23C 14/351* (2013.01);
(Continued)

(58) Field of Classification Search
CPC ............... H01J 37/3458; H01J 37/3447; H01J 37/3405; H01J 37/3452; H01J 37/345;
(Continued)

(56) References Cited

U.S. PATENT DOCUMENTS

| 4,957,605 A | 9/1990 | Hurwitt et al. |
| 5,126,028 A | 6/1992 | Hurwitt et al. |

(Continued)

FOREIGN PATENT DOCUMENTS

| JP | 06010125 A | 1/1994 |
| JP | 2009182140 A | 8/2009 |
| WO | WO 2010/0115128 A2 | 10/2010 |

OTHER PUBLICATIONS

Machine Translation JP 06010125 (Year: 1994).*
International Search Report and Written Opinion dated Jun. 27, 2017 for PCT Application No. PCT/US2017/020656.

*Primary Examiner* — Michael A Band
(74) *Attorney, Agent, or Firm* — MOSER TABOADA

(57) ABSTRACT

Methods and apparatus for processing substrates are disclosed. In some embodiments, a process chamber for processing a substrate includes: a body having an interior volume and a target to be sputtered, the interior volume including a central portion and a peripheral portion; a substrate support disposed in the interior volume opposite the target and having a support surface configured to support the substrate; a collimator disposed in the interior volume between the target and the substrate support; a first magnet disposed about the body proximate the collimator; a second magnet disposed about the body above the support surface and entirely below the collimator and spaced vertically
(Continued)

below the first magnet; and a third magnet disposed about the body and spaced vertically between the first magnet and the second magnet. The first, second, and third magnets are configured to generate respective magnetic fields to redistribute ions over the substrate.

20 Claims, 3 Drawing Sheets

Related U.S. Application Data continuation of application No. 15/448,996, filed on Mar. 3, 2017, now Pat. No. 11,037,768.

(60) Provisional application No. 62/304,173, filed on Mar. 5, 2016.

(51) Int. Cl.
*C23C 14/34* (2006.01)
*C23C 14/54* (2006.01)

(52) U.S. Cl.
CPC .......... *C23C 14/54* (2013.01); *H01J 37/3402* (2013.01); *H01J 37/345* (2013.01); *H01J 37/3405* (2013.01); *H01J 37/3411* (2013.01); *H01J 37/3441* (2013.01); *H01J 37/3447* (2013.01); *H01J 37/3452* (2013.01); *H01J 37/3455* (2013.01)

(58) Field of Classification Search
CPC ............. H01J 37/32339; C23C 14/351; C23C 14/345; C23C 14/54; C23C 14/35
See application file for complete search history.

(56) References Cited

U.S. PATENT DOCUMENTS

| | | |
|---|---|---|
| 5,156,703 A | 10/1992 | Oechsner |
| 6,368,469 B1 | 4/2002 | Nulman et al. |
| 6,488,822 B1 | 12/2002 | Moslehi et al. |
| 6,692,617 B1 | 2/2004 | Fu et al. |
| 6,730,196 B2 | 5/2004 | Wang et al. |
| 6,783,639 B2 * | 8/2004 | Nulman .............. H01J 37/3438 204/192.12 |
| 7,273,533 B2 | 9/2007 | Jozef et al. |
| 7,556,718 B2 | 7/2009 | Brcka |
| 7,561,015 B2 | 7/2009 | Vesci et al. |
| 7,686,926 B2 | 3/2010 | Gung et al. |
| 8,114,256 B2 | 2/2012 | Chang et al. |
| 8,920,613 B2 | 12/2014 | Boitnott et al. |
| 9,831,074 B2 | 11/2017 | Lee et al. |
| 9,887,072 B2 | 2/2018 | Pan et al. |
| 9,887,073 B2 | 2/2018 | Chi et al. |
| 9,953,813 B2 | 4/2018 | Tang et al. |
| 11,037,768 B2 | 6/2021 | Wang et al. |
| 2004/0140205 A1 | 7/2004 | Fu et al. |
| 2005/0263390 A1 | 12/2005 | Gung et al. |
| 2009/0308732 A1 | 12/2009 | Cao et al. |
| 2009/0308739 A1 | 12/2009 | Riker et al. |
| 2011/0233050 A1 | 9/2011 | Lesser et al. |
| 2014/0251789 A1 | 9/2014 | Miller |
| 2014/0251800 A1 | 9/2014 | Miller et al. |
| 2014/0305802 A1 | 10/2014 | Ding et al. |
| 2015/0114823 A1 | 4/2015 | Lee et al. |
| 2015/0357171 A1 | 12/2015 | Tang et al. |
| 2016/0145735 A1 | 5/2016 | Riker |

* cited by examiner

METHODS AND APPARATUS FOR CONTROLLING ION FRACTION IN PHYSICAL VAPOR DEPOSITION PROCESSES

CROSS-REFERENCE TO RELATED APPLICATIONS

This application is a continuation of U.S. patent application Ser. No. 17/101,933, filed Nov. 23, 2020, which is a continuation of U.S. patent application Ser. No. 15/448,996, filed Mar. 3, 2017, issued as U.S. Pat. No. 11,037,768 on Jun. 15, 2021, which claims benefit of U.S. Provisional Patent application Ser. No. 62/304,173, filed Mar. 5, 2016, the entire contents of each of the aforementioned related patent applications being herein incorporated by reference.

FIELD

Embodiments of the present disclosure generally relate to substrate processing chambers used in semiconductor manufacturing systems.

BACKGROUND

Sputtering, also known as physical vapor deposition (PVD), is a method of forming metallic features in integrated circuits. Sputtering deposits a material layer on a substrate. A source material, such as a target, is bombarded by ions strongly accelerated by an electric field. The bombardment ejects material from the target, and the material then deposits on the substrate. During deposition, ejected particles may travel in varying directions, rather than generally orthogonal to the substrate surface, undesirably resulting in overhanging structures formed on corners of high aspect ratio features in the substrate. Overhang may undesirably result in holes or voids formed within the deposited material, resulting in diminished electrical conductivity of the formed feature. Higher aspect ratio geometries have a higher degree of difficulty to fill without voids.

Controlling the ion fraction or ion density reaching the substrate surface to a desired range may improve the bottom and sidewall coverage during the metal layer deposition process (and reduce the overhang problem). In one example, the particles dislodged from the target may be controlled via a process tool such as a collimator to facilitate providing a more vertical trajectory of particles into the feature. The collimator provides relatively long, straight, and narrow passageways between the target and the substrate to filter out non-vertically travelling particles that impact and stick to the passageways of the collimator.

However, the inventors have discovered that in some applications, collimators may adversely affect the deposition uniformity on a substrate. Specifically, in some instances, the shape of the passageways is imprinted on the substrate. The inventors have further discovered that control over the ions, and the ion fraction (i.e., the number of ions versus number of neutral particles in the plasma) can be used to control deposition characteristics, such as uniformity and the like, on the substrate.

Thus, the inventors have provided improved embodiments of methods and apparatus for controlling the ion fraction in a physical vapor deposition process.

SUMMARY

Methods and apparatus for controlling the ion fraction in physical vapor deposition processes are disclosed. In some embodiments, a process chamber for processing a substrate having a given diameter includes: a body having an interior volume and a lid assembly including a target to be sputtered, wherein the interior volume includes a central portion having about the given diameter and a peripheral portion surrounding the central portion; a magnetron disposed above the target, wherein the magnetron is configured to rotate a plurality of magnets about a central axis of the process chamber to form an annular plasma in the peripheral portion of the interior volume, and wherein a radius of rotation of the plurality of magnets is substantially equal to or greater than the given diameter; a substrate support disposed in the interior volume opposite the target and having a support surface configured to support a substrate having the given diameter; a first set of magnets disposed about the body and proximate the target to form a magnetic field having substantially vertical magnetic field lines in the peripheral portion; a second set of magnets disposed about the body and above a support surface of the substrate support to form a magnetic field having magnetic field lines directed toward a center of the support surface; a first power source coupled to the target to electrically bias the target; and a second power source coupled to the substrate support to electrically bias the substrate support.

In some embodiments, a process chamber for processing a substrate having a given diameter includes: a body having an interior volume and a lid assembly including a target to be sputtered, wherein the interior volume includes a central portion having about the given diameter and a peripheral portion surrounding the central portion; a magnetron disposed above the target, wherein the magnetron is configured to rotate a plurality of magnets about a central axis of the process chamber to form a plasma in the peripheral portion of the interior volume, and wherein a radius of rotation of the plurality of magnets is substantially equal to or greater than the given diameter; a substrate support disposed in the interior volume opposite the target and having a support surface configured to support a substrate having the given diameter; a collimator disposed between the target and the substrate support; a first set of magnets disposed about the body and proximate the target to form a magnetic field having substantially vertical magnetic field lines in the peripheral portion and through the collimator; a second set of magnets disposed about the body and above a support surface of the substrate support to form a magnetic field having magnetic field lines directed toward a center of the support surface; a third set of magnets disposed about the body at a height even with or below a substrate-facing surface of the collimator, wherein the third set of magnets are configured to create a magnetic field having magnetic field lines directed inward and downward toward the central portion and toward the center of the support surface; a first power source coupled to the target to electrically bias the target; and a second power source coupled to the substrate support to electrically bias the substrate support.

In some embodiments, a method of processing a substrate includes: forming a plasma within an annular region of a process chamber above a substrate and proximate a target to sputter material from the target, wherein an inner diameter of the annular region is substantially equal to or greater than a diameter of the substrate such that a predominant portion of the plasma is disposed in a position both above and radially outward of the substrate; guiding materials sputtered from the target toward the substrate; and depositing materials sputtered form the target on the substrate.

In some embodiments, a process chamber for processing a substrate includes: a body including a ground adapter and a sidewall extending from the ground adapter, wherein the body has an interior volume; a target to be sputtered disposed in the interior volume and supported by the ground adapter; a substrate support disposed in the interior volume opposite the target and having a support surface configured to support the substrate; a collimator disposed in the interior volume between the target and the substrate support; a first electromagnet disposed about the body adjacent the ground adapter, wherein the first electromagnet is configured to generate a magnetic field to direct ions vertically through the collimator; a second electromagnet disposed about the body above the support surface of the substrate support and entirely below the collimator and spaced vertically below the first electromagnet, wherein the second electromagnet is configured to generate a magnetic field to direct ions vertically toward the support surface; and a third electromagnet disposed about the body and spaced vertically between the first electromagnet and the second electromagnet. The third electromagnet is configured to generate a magnetic field to direct ions vertically toward the support surface.

In some embodiments, a process chamber for processing a substrate includes: a body having an interior volume and a target to be sputtered, wherein the interior volume includes a central portion and a peripheral portion surrounding the central portion; a substrate support disposed in the interior volume opposite the target and having a support surface configured to support the substrate; a collimator disposed in the interior volume between the target and the substrate support; a first magnet disposed about the body proximate the collimator; a second magnet disposed about the body above the support surface of the substrate support and entirely below the collimator and spaced vertically below the first magnet; and a third magnet disposed about the body and spaced vertically between the first magnet and the second magnet. The first magnet, the second magnet, and the third magnet are configured to generate respective magnetic fields in the interior volume to redistribute ions from the peripheral portion to the central portion and over the substrate.

A process chamber for processing a substrate includes: a body having an interior volume and a target to be sputtered, wherein the interior volume includes a central portion and a peripheral portion surrounding the central portion; a substrate support disposed in the interior volume opposite the target and having a support surface configured to support the substrate; a collimator disposed in the interior volume between the target and the substrate support; a first electromagnet disposed about the body disposed above a lower face of the collimator and configured to generate a magnetic field having substantially vertical magnetic field lines in the peripheral portion of the interior volume; a second electromagnet disposed about the body above the support surface of the substrate support and entirely below the collimator and spaced vertically below the first electromagnet, wherein the second electromagnet is configured to generate a magnetic field having magnetic field lines directed toward a center of the support surface; and a third electromagnet disposed about the body and spaced vertically between the first electromagnet and the second electromagnet and above the second electromagnet and below a substrate-facing surface of the collimator. The third electromagnet is configured to generate a magnetic field having magnetic field lines directed inward and downward toward the central portion and toward the center of the support surface.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
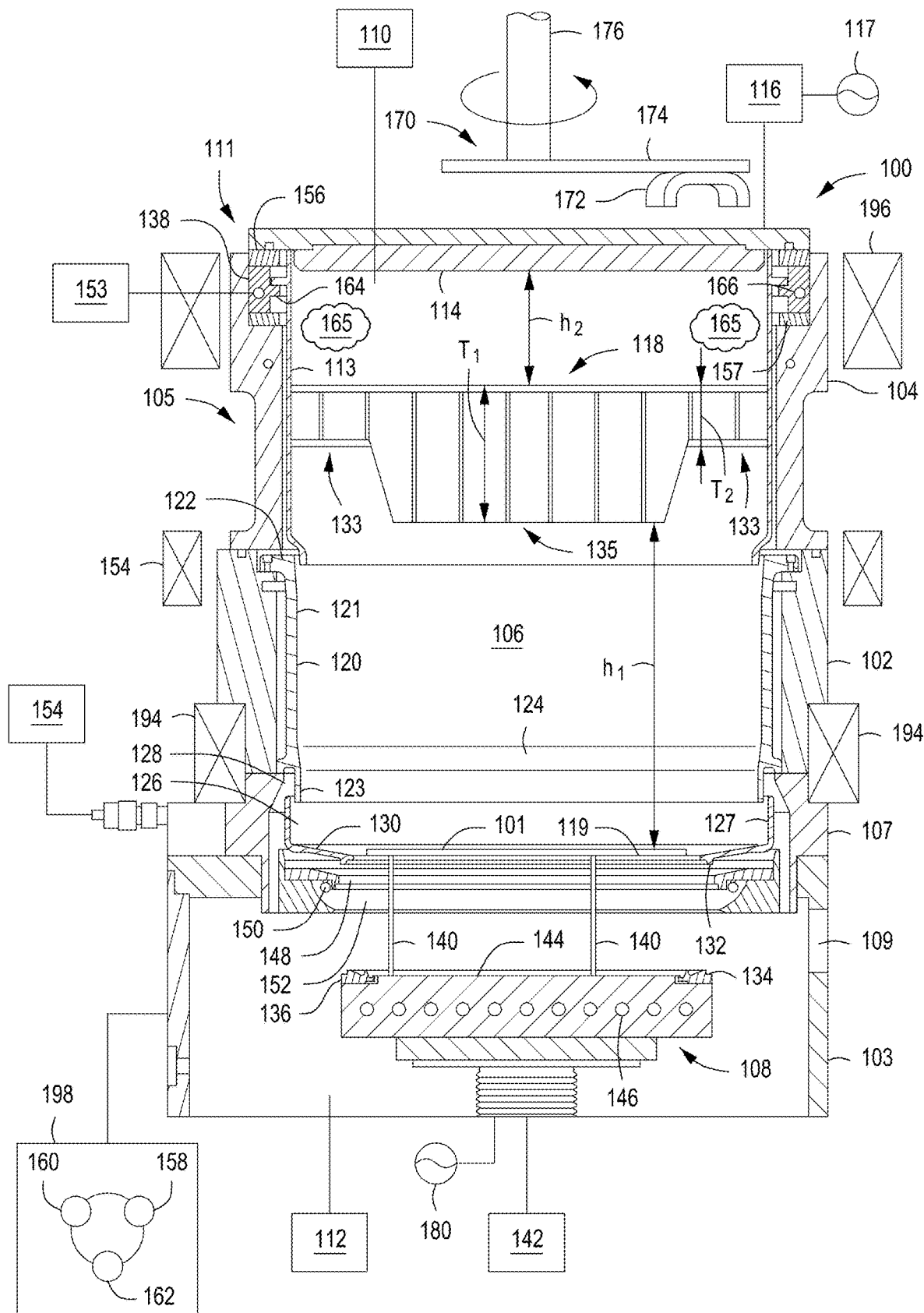
FIG. 1 depicts a schematic cross-sectional view of a process chamber in accordance with the some embodiments of the present disclosure.

To facilitate understanding, identical reference numerals have been used, where possible, to designate identical elements that are common to the figures. The figures are not drawn to scale and may be simplified for clarity. Elements and features of some embodiments may be beneficially incorporated in other embodiments without further recitation.

DETAILED DESCRIPTION

Embodiments of methods and apparatus for controlling the ion fraction in physical vapor deposition processes are disclosed herein. The inventive methods and apparatus advantageously provide for greater control over the ions in PVD processes, thus further advantageously facilitating control over deposition results, such as uniformity of deposition of material on a substrate. Embodiments of the inventive apparatus and methods may also advantageously improve deposition in features in a substrate and reduces the necessary deposition rate by increasing the number of ions and decreasing the number of neutrals deposited on the substrate.

Embodiments of the present disclosure are illustratively described herein with respect to a physical vapor deposition (PVD) chamber. However, the inventive method may be used in any process chamber modified in accordance with the teachings disclosed herein. FIG. 1 illustrates a PVD chamber (process chamber 100), e.g., a sputter process chamber, in accordance with embodiments of the present disclosure, suitable for sputter depositing materials on a substrate having a given diameter. In some embodiments, the PVD chamber further includes a collimator 118 disposed therein and supported by a process tool adapter 138. In the embodiment illustrated in FIG. 1, the process tool adapter 138 is a cooled process tool adapter. Illustrative examples of suitable PVD chambers that may be adapted to benefit from the disclosure include the ALPS® Plus and SIP ENCORE® PVD processing chambers, both commercially available from Applied Materials, Inc., of Santa Clara, Calif. Other processing chambers available from Applied Materials, Inc. as well as other manufacturers may also be adapted in accordance with the embodiments described herein.

The process chamber 100 generally includes an upper sidewall 102, a lower sidewall 103, a ground adapter 104, and a lid assembly 111 defining a body 105 that encloses an interior volume 106. The interior volume 106 includes a central portion having about the given diameter of the substrate to be processed and a peripheral portion surrounding the central portion. In addition, the interior volume 106 includes an annular region above the substrate and proximate a target, wherein an inner diameter of the annular region is substantially equal to or greater than a diameter of the substrate such that a predominant portion of the plasma is disposed in a position both above and radially outward of the substrate.

An adapter plate 107 may be disposed between the upper sidewall 102 and the lower sidewall 103. A substrate support 108 is disposed in the interior volume 106 of the process chamber 100. The substrate support 108 is configured to support a substrate having a given diameter (e.g., 150 mm, 200 mm, 300 mm, 450 mm, or the like). A substrate transfer port 109 is formed in the lower sidewall 103 for transferring substrates into and out of the interior volume 106.

In some embodiments, the process chamber 100 is configured to deposit, for example, titanium, aluminum oxide, aluminum, aluminum oxynitride, copper, tantalum, tantalum nitride, tantalum oxynitride, titanium oxynitride, tungsten, or tungsten nitride on a substrate, such as the substrate 101. Non-limiting examples of suitable applications include seed layer deposition in vias, trenches, dual damascene structures, or the like.

A gas source 110 is coupled to the process chamber 100 to supply process gases into the interior volume 106. In some embodiments, process gases may include inert gases, non-reactive gases, and reactive gases, if necessary. Examples of process gases that may be provided by the gas source 110 include, but not limited to, argon gas (Ar), helium (He), neon gas (Ne), nitrogen gas ($N_2$), oxygen gas ($O_2$), and water ($H_2O$) vapor among others.

A pumping device 112 is coupled to the process chamber 100 in communication with the interior volume 106 to control the pressure of the interior volume 106. In some embodiments, during deposition the pressure level of the process chamber 100 may be maintained at about 1 Torr or less. In some embodiments, the pressure level of the process chamber 100 may be maintained at about 500 mTorr or less during deposition. In some embodiments, the pressure level of the process chamber 100 may be maintained at about 1 mTorr to about 300 mTorr during deposition.

The ground adapter 104 may support a target, such as target 114. The target 114 is fabricated from a material to be deposited on the substrate. In some embodiments, the target 114 may be fabricated from titanium (Ti), tantalum (Ta), tungsten (W), cobalt (Co), nickel (Ni), copper (Cu), aluminum (Al), alloys thereof, combinations thereof, or the like. In some embodiments, the target 114 may be fabricated from copper (Cu), titanium (Ti), tantalum (Ta), or aluminum (Al).

The target 114 may be coupled to a source assembly comprising a power supply 117 for the target 114. In some embodiments, the power supply 117 may be an RF power supply, which may be coupled to the target 114 via a match network 116. In some embodiments, the power supply 117 may alternatively be a DC power supply, in which case the match network 116 is omitted. In some embodiments, the power supply 117 may include both DC and RF power sources.

A magnetron 170 is positioned above the target 114. The magnetron 170 may include a plurality of magnets 172 supported by a base plate 174 connected to a shaft 176, which may be axially aligned with the central axis of the process chamber 100 and the substrate 101. The magnets 172 produce a magnetic field within the process chamber 100 near the front face of the target 114 to generate plasma so a significant flux of ions strike the target 114, causing sputter emission of target material. The magnets 172 may be rotated about the shaft 176 to increase uniformity of the magnetic field across the surface of the target 114. Examples of the magnetron include an electromagnetic linear magnetron, a serpentine magnetron, a spiral magnetron, a double-digitated magnetron, a rectangularized spiral magnetron, a dual motion magnetron, among others. The magnets 172 are rotated about the central axis of the process chamber 100 within an annular region extending between about the outer diameter of the substrate to about the outer diameter of the interior volume 106. In general, magnets 172 may be rotated such that the innermost magnet position during rotation of the magnets 172 is disposed above or outside of the diameter of the substrate being processed (e.g., the distance from the axis of rotation to the innermost position of the magnets 172 is equal to or greater than the diameter of the substrate being processed).

The magnetron may have any suitable pattern of motion wherein the magnets of the magnetron are rotated within an annular region between about the outer diameter of the substrate and the inner diameter of the processing volume. In some embodiments, the magnetron 170 has a fixed radius of rotation of the magnets 172 about the central axis of the process chamber 100. In some embodiments, the magnetron 170 is configured to have either multiple radii or an adjustable radii of rotation of the magnets 172 about the central axis of the process chamber 100. For example, in some embodiments, the magnetron can have a radius of rotation that is adjustable between about 5.5 inches and about 7 inches (for example, for processing a 300 mm substrate). For example, in some embodiments, the magnetron has a dual motion in which the magnets 172 are rotated at a first radius (for example, about 6.7 inches when processing 300 mm substrates) for a first predetermined time period, and at a second radius (for example, about 6.0 inches when processing 300 mm substrates) for a second predetermined time period. In some embodiments the first and second predetermined time periods are substantially equal (e.g., the magnetron is rotated at the first radius for about half of the processing time and at the second radius for about half of the processing time). In some embodiments, the magnetron may have rotate at a plurality of radii (i.e., more than just two) that may be discretely set for distinct time periods, or that vary continuously throughout processing. The inventors have discovered that target life and plasma stability are advantageously further improved when processing using multi-radii rotation of the magnetron.

The process chamber 100 further includes an upper shield 113 and a lower shield 120. A collimator 118 is positioned in the interior volume 106 between the target 114 and the substrate support 108. In some embodiments, the collimator 118 has a central region 135 having a thickness $T_1$ and a peripheral region 133 having a thickness $T_2$ less than $T_1$. The central region 135 generally corresponds to the diameter of the substrate being processed (e.g., is equal to or substantially equal to the diameter of the substrate). Thus, the peripheral region 133 generally corresponds to an annular region radially outward of the substrate being processed (e.g., the inner diameter of the peripheral region 133 is substantially equal to or greater than the diameter of the substrate). Alternatively, the central region of the collimator 118 may have a diameter greater than that of the substrate being processed. In some embodiments, the collimator 118 may have a uniform thickness across the whole collimator without separate central and peripheral regions. The collimator 118 is coupled to the upper shield 113 using any fixation means. In some embodiments, the collimator 118 may be formed integrally with the upper shield 113. In some embodiments, the collimator 118 may be coupled to some other component within the process chamber and help in position with respect to the upper shield 113.

In some embodiments, the collimator 118 may be electrically biased to control ion flux to the substrate and neutral angular distribution at the substrate, as well as to increase the deposition rate due to the added DC bias. Electrically biasing the collimator results in reduced ion loss to the collimator, advantageously providing greater ion/neutral ratios at the substrate. A collimator power source 190 (shown in FIG. 2) is coupled to the collimator 118 to facilitate biasing of the collimator 118.

In some embodiments, the collimator 118 may be electrically isolated from grounded chamber components such as the ground adapter 104. For example, as depicted in FIG. 1, the collimator 118 is coupled to the upper shield 113, which in turn is coupled to the process tool adapter 138. The process tool adapter 138 may be made from suitable conductive materials compatible with processing conditions in the process chamber 100. An insulator ring 156 and an insulator ring 157 are disposed on either side of the process tool adapter 138 to electrically isolate the process tool adapter 138 from the ground adapter 104. The insulator rings 156, 157 may be made from suitable process compatible dielectric materials.

In some embodiments, a first set of magnets 196 may be disposed adjacent to the ground adapter 104 to assist with generating the magnetic field to guide dislodged ions from the target 114 through the peripheral region 133. The magnetic field formed by the first set of magnets 196 may alternatively or in combination prevent ions from hitting the sidewalls of the chamber (or sidewalls of the upper shield 113) and direct the ions vertically through the collimator 118. For example, the first set of magnets 196 are configured to form a magnetic field having substantially vertical magnetic field lines in the peripheral portion. The substantially vertical magnetic field lines advantageously guide ions through the peripheral portion of the interior volume, and, when present, through the peripheral region 133 of the collimator 118.

In some embodiments, a second set of magnets 194 may be disposed in a position to form a magnetic field between the bottom of the collimator 118 and the substrate to guide the metallic ions dislodged from the target 114 and distribute the ions more uniformly over the substrate 101. For example, in some embodiments, the second set of magnets may be disposed between the adapter plate 107 and the upper sidewall 102. For example, the second set of magnets 194 are configured to form a magnetic field having magnetic field lines directed toward a center of the support surface. The magnetic field lines directed toward the center of the support surface advantageously redistribute ions from the peripheral portion of the interior volume to the central portion of the interior volume and over the substrate 101.

In some embodiments, a third set of magnets 154 may be disposed between the first and second set of magnets 196, 194 and about centered with or below a substrate-facing surface of the central region 135 of the collimator 118 to further guide the metallic ions towards the center of the substrate 101. For example, the third set of magnets 154 are configured to create a magnetic field having magnetic field lines directed inward and downward toward the central portion and toward the center of the support surface. The magnetic field lines directed toward the center of the support surface further advantageously redistribute ions from the peripheral portion of the interior volume to the central portion of the interior volume and over the substrate 101.

The numbers of the magnets disposed around the process chamber 100 may be selected to control plasma dissociation, sputtering efficiency, and ion control. The first, second, and third sets of magnets 196, 194, 154 may include any combination of electromagnets and/or permanent magnets necessary to guide the metallic ions along a desired trajectory from the target, through the collimator, and toward the center of the substrate support 108. The first, second, and third sets of magnets 196, 194, 154 may be stationary or moveable to adjust the position of a set of magnets in a direction parallel to a central axis of the chamber.

An RF power source 180 may be coupled to the process chamber 100 through the substrate support 108 to provide a bias power between the target 114 and the substrate support 108. In some embodiments, the RF power source 180 may have a frequency between about 400 Hz and about 60 MHz, such as about 13.56 MHz. In some embodiments, the third set of magnets 154 may be excluded and the bias power used to attract the metallic ions towards the center of the substrate 101.

In operation, the magnets 172 are rotated to form a plasma 165 in the annular portion of the interior volume 106 to sputter the target 114. The plasma 165 may be formed above the peripheral region 133 of the collimator, when the collimator 118 is present to sputter the target 114 above the peripheral region 133. The radius of rotation of the magnets 172 is greater than the radius of the substrate 101 to ensure that little to no sputtered material exists above the substrate 101. Non-limiting examples of suitable magnetrons that can be modified to rotate at a suitable radius or range of radii in accordance with the present disclosure include the magnetron disclosed in U.S. Pat. No. 8,114,256, issued Feb. 14, 2012 to Chang et al., and entitled "Control of Arbitrary Scan Path of a Rotating Magnetron," and U.S. Pat. No. 9,580,795, issued Feb. 28, 2017 to Miller et al., and entitled "Sputter Source for Use in a Semiconductor Process Chamber."

The first set of magnets 196 forms a magnetic field proximate the peripheral region 133 to attract the sputtered materials towards the peripheral region 133. In some embodiments, a predominant portion of the sputtered materials (e.g., the ionized sputtered materials) are drawn toward the peripheral region by the first set of magnets.

The collimator 118 is positively biased so that the metallic sputtered material is forced through the collimator 118. However, because the plasma 165 and most, if not all, of the metallic sputtered material are disposed at the peripheral region 133, the metallic sputtered material only travels through the peripheral region 133. Moreover, most, if not all, of the neutral sputtered material traveling toward the central region of the collimator will likely collide with and stick to the collimator walls. In addition to the bias power applied to the substrate support 108, the second set of magnets 194 and the third set of magnets 154 (when present) redirect the trajectory of the sputtered metallic ions towards the center of the substrate 101. As a result, imprints on the substrate caused by the shape of the collimator 118 are avoided and a more uniform deposition is achieved.

Because the directionality of the metallic neutrals cannot be changed, most, if not all, of the metallic neutrals are advantageously not deposited on the substrate. To ensure that the trajectory of the sputtered metallic ions has enough space to be changed, the collimator 118 is disposed at a predetermined height $h_1$ above a support surface 119 of the substrate support 108. In some embodiments, the height $h_1$ (measured from the bottom of the collimator 118 to the support surface 119) is between about 400 mm to about 800 mm, for example, about 600 mm. The height $h_1$ is also chosen to facilitate control of ions using the magnetic field beneath the collimator 118 to further improve deposition characteristics on the substrate 101. To enable modulation of the magnetic field above the collimator 118, the collimator 118 may be disposed at a predetermined height $h_2$ beneath the target 114. The height $h_2$ may be between about 25 mm to about 75 mm, for example, about 50 mm. The overall target to substrate spacing (or target to support surface spacing), is about 600 mm to about 800 mm.

The process tool adapter 138 includes one or more features to facilitate supporting a process tool within the interior volume 106, such as the collimator 118. For example, as shown in FIG. 1, the process tool adapter 138 includes a mounting ring, or shelf 164 that extends in a radially inward direction to support the upper shield 113. In some embodiments, the mounting ring or shelf 164 is a continuous ring about the inner diameter of the process tool adapter 138 to facilitate more uniform thermal contact with the upper shield 113 mounted to the process tool adapter 138.

In some embodiments, a coolant channel 166 may be provided in the process tool adapter 138 to facilitate flowing a coolant through the process tool adapter 138 to remove heat generated during processing. For example, the coolant channel 166 may be coupled to a coolant source 153 to provide a suitable coolant, such as water. The coolant channel 166 advantageously removes heat from the process tool (e.g., collimator 118) that is not readily transferred to other cooled chamber components, such as the ground adapter 104. For example, the insulator rings 156, 157 disposed between the process tool adapter 138 and the ground adapter 104 are typically made from materials with poor thermal conductivity. Thus, the insulator rings 156, 157 reduce the rate of heat transfer from the collimator 118 to the ground adapter 104 and the process tool adapter 138 advantageously maintains or increases the rate of cooling of the collimator 118. In addition to the coolant channel 166 provided in the process tool adapter 138, the ground adapter 104 may also include a coolant channel to further facilitate removing heat generated during processing.

A radially inwardly extending ledge (e.g., the mounting ring, or shelf 164) is provided to support the upper shield 113 within the central opening within the interior volume 106 of the process chamber 100. In some embodiments the shelf 164 is disposed in a location proximate the coolant channel 166 to facilitate maximizing the heat transfer from the collimator 118 to the coolant flowing in the coolant channel 166 during use.

In some embodiments, the lower shield 120 may be provided in proximity to the collimator 118 and interior of the ground adapter 104 or the upper sidewall 102. The collimator 118 includes a plurality of apertures to direct gas and/or material flux within the interior volume 106. The collimator 118 may be coupled to the collimator power source via the process tool adapter 138.

The lower shield 120 may include a tubular body 121 having a radially outwardly extending flange 122 disposed in an upper surface of the tubular body 121. The flange 122 provides a mating interface with an upper surface of the upper sidewall 102. In some embodiments, the tubular body 121 of the lower shield 120 may include a shoulder region 123 having an inner diameter that is less than the inner diameter of the remainder of the tubular body 121. In some embodiments, the inner surface of the tubular body 121 transitions radially inward along a tapered surface 124 to an inner surface of the shoulder region 123. A shield ring 126 may be disposed in the process chamber 100 adjacent to the lower shield 120 and intermediate of the lower shield 120 and the adapter plate 107. The shield ring 126 may be at least partially disposed in a recess 128 formed by an opposing side of the shoulder region 123 of the lower shield 120 and an interior sidewall of the adapter plate 107.

In some embodiments, the shield ring 126 may include an axially projecting annular sidewall 127 that has an inner diameter that is greater than an outer diameter of the shoulder region 123 of the lower shield 120. A radial flange 130 extends from the annular sidewall 127. The radial flange 130 may be formed at an angle greater than about ninety degrees (90°) relative to the inside diameter surface of the annular sidewall 127 of the shield ring 126. The radial flange 130 includes a protrusion 132 formed on a lower surface of the radial flange 130. The protrusion 132 may be a circular ridge extending from the surface of the radial flange 130 in an orientation that is substantially parallel to the inside diameter surface of the annular sidewall 127 of the shield ring 126. The protrusion 132 is generally adapted to mate with a recess 134 formed in an edge ring 136 disposed on the substrate support 108. The recess 134 may be a circular groove formed in the edge ring 136. The engagement of the protrusion 132 and the recess 134 centers the shield ring 126 with respect to the longitudinal axis of the substrate support 108. The substrate 101 (shown supported on lift pins 140) is centered relative to the longitudinal axis of the substrate support 108 by coordinated positioning calibration between the substrate support 108 and a robot blade (not shown). Thus, the substrate 101 may be centered within the process chamber 100 and the shield ring 126 may be centered radially about the substrate 101 during processing.

In operation, a robot blade (not shown) having the substrate 101 disposed thereon is extended through the substrate transfer port 109. The substrate support 108 may be lowered to allow the substrate 101 to be transferred to the lift pins 140 extending from the substrate support 108. Lifting and lowering of the substrate support 108 and/or the lift pins 140 may be controlled by a drive 142 coupled to the substrate support 108. The substrate 101 may be lowered onto a substrate receiving surface 144 of the substrate support 108. With the substrate 101 positioned on the substrate receiving surface 144 of the substrate support 108, sputter deposition may be performed on the substrate 101. The edge ring 136 may be electrically insulated from the substrate 101 during processing. Therefore, the substrate receiving surface 144 may include a height that is greater than a height of portions of the edge ring 136 adjacent the substrate 101 such that the substrate 101 is prevented from contacting the edge ring 136. During sputter deposition, the temperature of the substrate 101 may be controlled by utilizing thermal control channels 146 disposed in the substrate support 108.

After sputter deposition, the substrate 101 may be elevated utilizing the lift pins 140 to a position that is spaced away from the substrate support 108. The elevated location may be proximate one or both of the shield ring 126 and a reflector ring 148 adjacent to the adapter plate 107. The adapter plate 107 includes one or more lamps 150 coupled to the adapter plate 107 at a position intermediate of a lower surface of the reflector ring 148 and a concave surface 152 of the adapter plate 107. The lamps 150 provide optical and/or radiant energy in the visible or near visible wavelengths, such as in the infra-red (IR) and/or ultraviolet (UV) spectrum. The energy from the lamps 150 is focused radially inward toward the backside (i.e., lower surface) of the substrate 101 to heat the substrate 101 and the material deposited thereon. Reflective surfaces on the chamber components surrounding the substrate 101 serve to focus the energy toward the backside of the substrate 101 and away from other chamber components where the energy would be lost and/or not utilized. The adapter plate 107 may be coupled to the coolant source 153 to control the temperature of the adapter plate 107 during heating.

After controlling the substrate 101 to a predetermined temperature, the substrate 101 is lowered to a position on the substrate receiving surface 144 of the substrate support 108. The substrate 101 may be rapidly cooled utilizing the thermal control channels 146 in the substrate support 108 via conduction. The temperature of the substrate 101 may be ramped down from the first temperature to a second temperature in a matter of seconds to about a minute. The substrate 101 may be removed from the process chamber 100 through the substrate transfer port 109 for further processing. The substrate 101 may be maintained at a predetermined temperature range, such as less than 250 degrees Celsius.

A controller 198 is coupled to the process chamber 100. The controller 198 includes a central processing unit (CPU) 160, a memory 158, and support circuits 162. The controller 198 is utilized to control the process sequence, regulating the gas flows from the gas source 110 into the process chamber 100 and controlling ion bombardment of the target 114. The CPU 160 may be of any form of a general purpose computer processor that can be used in an industrial setting. The software routines can be stored in the memory 158, such as random access memory, read only memory, floppy or hard disk drive, or other form of digital storage. The support circuits 162 are conventionally coupled to the CPU 160 and may comprise cache, clock circuits, input/output subsystems, power supplies, and the like. The software routines, when executed by the CPU 160, transform the CPU into a specific purpose computer (controller) 198 that controls the process chamber 100 such that the processes, including the plasma ignition processes disclosed below, are performed in accordance with embodiments of the present disclosure. The software routines may also be stored and/or executed by a second controller (not shown) that is located remotely from the process chamber 100.

During processing, material is sputtered from the target 114 and deposited on the surface of the substrate 101. The target 114 and the substrate support 108 are biased relative to each other by the power supply 117 or the RF power source 180 to maintain a plasma formed from the process gases supplied by the gas source 110. The DC pulsed bias power applied to the collimator 118 also assists controlling ratio of the ions and neutrals passing through the collimator 118, advantageously enhancing the trench sidewall and bottom fill-up capability. The ions from the plasma are accelerated toward and strike the target 114, causing target material to be dislodged from the target 114. The dislodged target material and process gases forms a layer on the substrate 101 with desired compositions.

Figure 2:
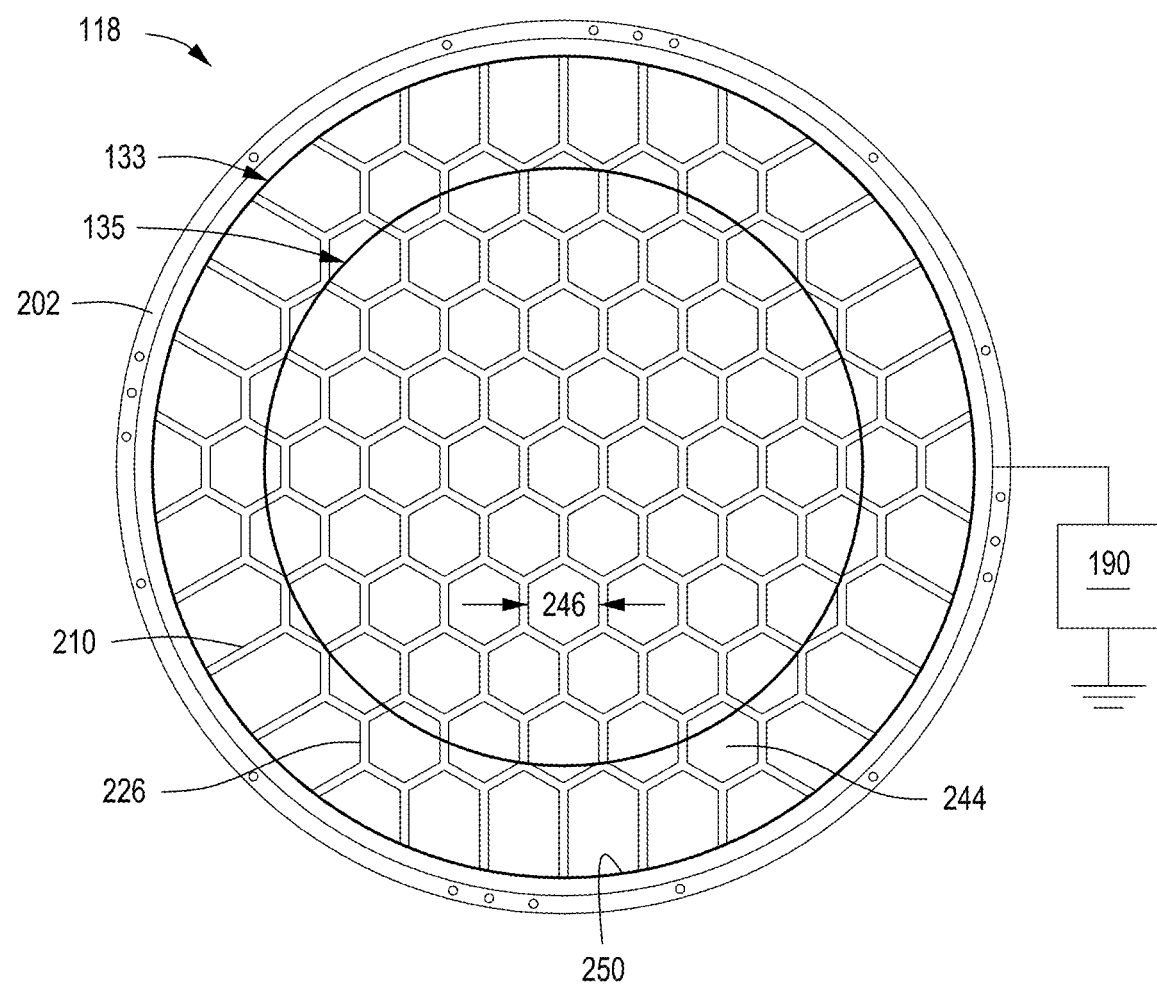
FIG. 2 depicts a top view of a collimator in accordance with some embodiments of the present disclosure.

FIG. 2 depicts a top view of the illustrative collimator 118 coupled to the collimator power source 190 that may be disposed in the process chamber 100 of FIG. 1. In some embodiments, the collimator 118 has a generally honeycomb structure having hexagonal walls 226 separating hexagonal apertures 244 in a close-packed arrangement. However, other geometric configurations may also be used. An aspect ratio of the hexagonal apertures 244 may be defined as the depth of the aperture 244 (equal to the length of the collimator) divided by the width 246 of the aperture 244. In some embodiments, the thickness of the walls 226 is about 0.06 inches to about 0.18 inches. In some embodiments, the thickness of the walls 226 is about 0.12 inches to about 0.15 inches. In some embodiments, the aspect ratio of the hexagonal apertures 244 may be between about 1:1 to about 1:5 in the peripheral region 133 and about 3:5 to about 3:6 in the central region 135. In some embodiments, the collimator 118 is comprised of a material selected from aluminum, copper, and stainless steel.

The honeycomb structure of the collimator 118 may serve as an integrated flux optimizer 210 to optimize the flow path, ion fraction, and ion trajectory behavior of ions passing through the collimator 118. In some embodiments, the hexagonal walls 226 adjacent to a shield portion 202 have a chamfer 250 and a radius. The shield portion 202 of the collimator 118 may assist installing the collimator 118 into the process chamber 100.

In some embodiments, the collimator 118 may be machined from a single mass of aluminum. The collimator 118 may optionally be coated or anodized. Alternatively, the collimator 118 may be made from other materials compatible with the processing environment, and may also be comprised of one or more sections. Alternatively, the shield portion 202 and the integrated flux optimizer 210 are formed as separate pieces and coupled together using suitable attachment means, such as welding.

Figure 3:
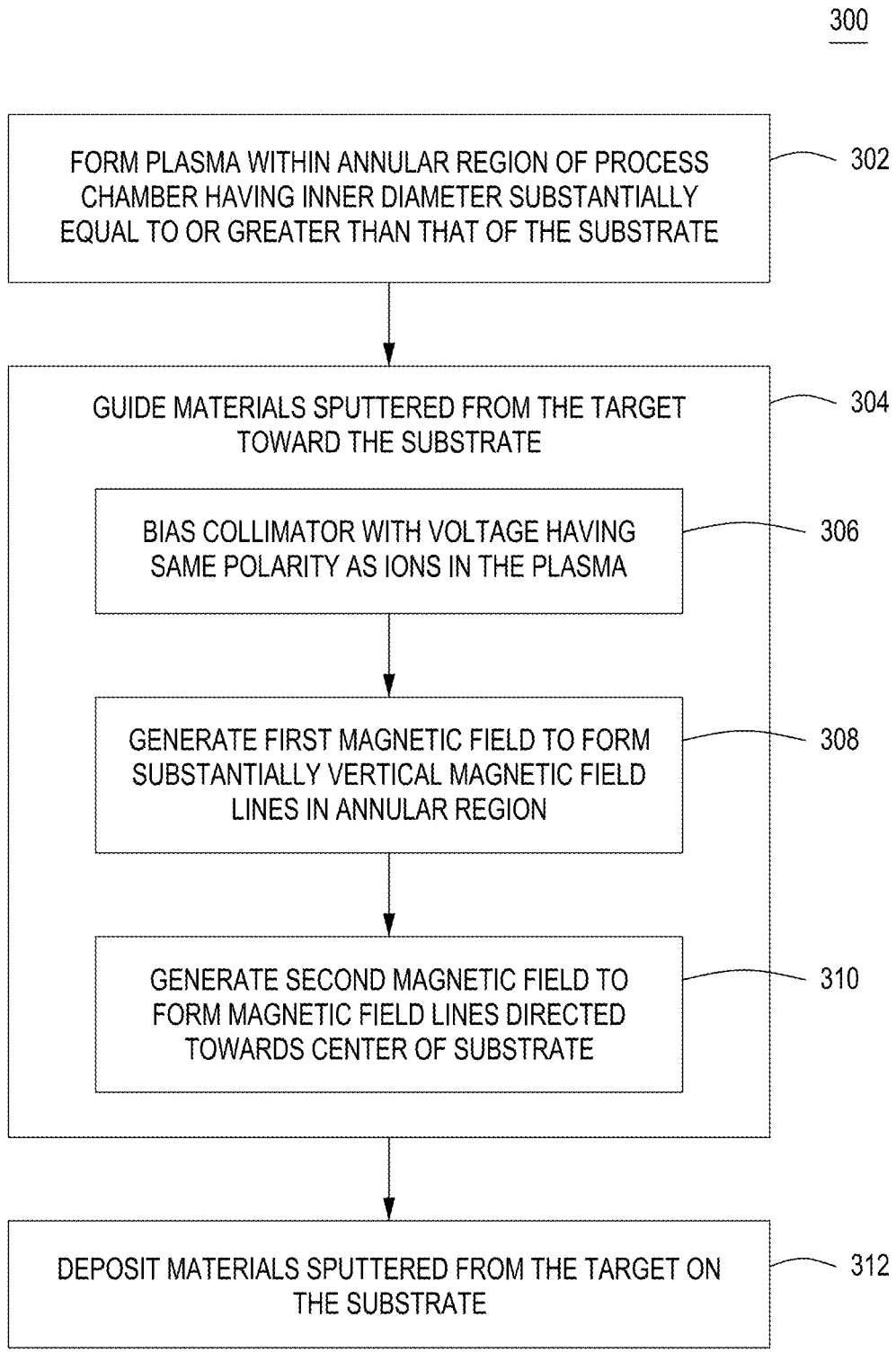
FIG. 3 is a flowchart depicting a method of processing a substrate in accordance with some embodiments of the present disclosure.

FIG. 3 illustrates a method 300 for processing a substrate. The method 300 may be performed in an apparatus similar to that discussed above and is described in connection with the process chamber 100 of FIG. 1. The method generally begins at 302, where a plasma is formed within an annular region of the process chamber 100. The annular region has an inner diameter substantially equal to or greater than that of the substrate 101. For example, the plasma can be formed within an annular region of a process chamber above a substrate and proximate a target to sputter material from the target, wherein an inner diameter of the annular region is substantially equal to or greater than a diameter of the substrate such that a predominant portion of the plasma is disposed in a position both above and radially outward of the substrate.

At 304, materials sputtered from the target are guided toward the substrate. The materials (e.g., ions) may be guided toward the substrate using any of the techniques disclosed herein, alone or in combination. For example, in some embodiments, a collimator (e.g., collimator 118) may be provided to filter out materials, such as neutral particles, that do not travel substantially vertically toward the substrate 101 and thus hit and stick to the sidewalls of the passages of the collimator 118. In addition, the collimator 118 may be electrically biased with a voltage having a polarity that is the same as the polarity of ions formed in the plasma to reduce impingement of ions on the sidewalls of the passages of the collimator and to straighten out the trajectory of the ions to be more vertical, as indicated at 306. For example, a positive voltage may be provided when positively charged ions (such as copper ions) are present. Alternatively or in combination, a first magnetic field can be generated using a first set of magnets to form a magnetic field having substantially vertical magnetic field lines in the annular region (and through the collimator 118, when present), as indicated at 308. Alternatively or in combination with the foregoing, a second magnetic field can be generated using a second set of magnets to form a magnetic field having magnetic field lines directed toward a center of the substrate, as indicated at 310. Alternatively or in combination with the foregoing, a third magnetic field can be generated using a third set of magnets to create a magnetic field having magnetic field lines directed inward and downward toward the center of the substrate. Alternatively or in combination with the foregoing, the substrate support can be electrically biased to attract ions toward the substrate.

Next, at 312, materials sputtered from the target are deposited on the substrate. Upon deposition to a desired thickness, the method 300 generally ends and further processing of the substrate may be performed.

For example, in some embodiments of the method 300, the plasma 165 is formed above the peripheral region 133 of the collimator 118 using the magnets 172 and material is sputtered from the target 114 above the peripheral region 133. A first magnetic field is generated proximate the peripheral region 133 to attract the sputtered materials towards the peripheral region 133 using the first set of magnets 196. The collimator 118 is biased with a positive voltage to draw the sputtered material through the peripheral region 133 of collimator 118. A second magnetic field is generated below the collimator 118 to draw the materials through the collimator 118 and redirect ions of the sputtered material towards the center of the substrate support. The second magnetic field can be generated by one or more of the bias power applied to the substrate support 108, the second set of magnets 194. Optionally, a third magnetic field can be generated using the third set of magnets 154 to create a magnetic field having magnetic field lines directed inward and downward toward the center of the substrate 101. In addition, the substrate support 108 can be electrically biased to attract ions toward the substrate 101.

Thus, embodiments methods and apparatus for improving substrate deposition uniformity have been disclosed herein. The inventors have observed that the inventive methods and apparatus substantially eliminate imprints caused by conventional deposition processes using a collimator and result in more uniform deposition on the substrate being processed.

While the foregoing is directed to embodiments of the present disclosure, other and further embodiments of the disclosure may be devised without departing from the basic scope thereof.

The invention claimed is:

1. A process chamber for processing a substrate, comprising:
   a body including a ground adapter and a sidewall extending from the ground adapter, wherein the body has an interior volume;
   a target to be sputtered disposed in the interior volume and supported by the ground adapter;
   a substrate support disposed in the interior volume opposite the target and having a support surface configured to support the substrate;
   a collimator disposed in the interior volume between the target and the substrate support;
   a first electromagnet disposed about the body adjacent the ground adapter, wherein the first electromagnet is configured to generate a magnetic field to direct ions vertically through the collimator;
   a second electromagnet disposed about the body above the support surface of the substrate support and entirely below the collimator and spaced vertically below the first electromagnet, wherein the second electromagnet is configured to generate a magnetic field to direct ions vertically toward the support surface; and
   a third electromagnet disposed about the body and spaced vertically between the collimator and the second electromagnet, wherein the third electromagnet is configured to generate a magnetic field to direct ions vertically toward the support surface.

2. The process chamber according to claim 1, further comprising:
   a collimator power source coupled to the collimator and configured to bias the collimator;
   a first power source coupled to the target to electrically bias the target; and
   a second power source coupled to the substrate support to electrically bias the substrate support.

3. The process chamber according to claim 2, further comprising a magnetron disposed above the target, wherein the magnetron is configured to form an annular plasma in the interior volume.

4. The process chamber according to claim 3, further comprising a controller configured to control the magnetron to form the annular plasma, the first power source and the second power source to respectively bias the target and the substrate support relative to each other to maintain the annular plasma formed over the collimator and, while maintaining the annular plasma over the collimator, controlling the collimator power source to bias the collimator to control a ratio of ions and neutrals of sputter material through the collimator, the first electromagnet to guide the ions through the collimator, and the second electromagnet to guide the ions toward a center of the support surface.

5. The process chamber according to claim 1, wherein the third electromagnet is entirely disposed below the collimator.

6. The process chamber according to claim 5, wherein the third electromagnet is entirely disposed above the second electromagnet.

7. The process chamber according to claim 1, wherein the first electromagnet is disposed above a substrate-facing surface of the collimator.

8. The process chamber according to claim 1, wherein at least one of the first electromagnet, the second electromagnet, or the third electromagnet is moveable in a direction parallel to a central axis of the process chamber.

9. A process chamber for processing a substrate, comprising:
   a body having an interior volume and a target to be sputtered, wherein the interior volume includes a central portion and a peripheral portion surrounding the central portion;
   a substrate support disposed in the interior volume opposite the target and having a support surface configured to support the substrate;
   a collimator disposed in the interior volume between the target and the substrate support;
   a first magnet disposed about the body proximate the collimator;
   a second magnet disposed about the body above the support surface of the substrate support and entirely below the collimator and spaced vertically below the first magnet; and
   a third magnet disposed about the body and spaced vertically between the collimator and the second magnet, wherein the first magnet, the second magnet, and the third magnet are configured to generate respective magnetic fields in the interior volume to redistribute ions from the peripheral portion to the central portion and over the substrate.

10. The process chamber according to claim 9, wherein at least one of the first magnet, the second magnet, or the third magnet is an electromagnet.

11. The process chamber according to claim 10, wherein the third magnet is an electromagnet.

12. The process chamber according to claim 9, further comprising:
a collimator power source coupled to the collimator and configured to bias the collimator;
a first power source coupled to the target to electrically bias the target; and
a second power source coupled to the substrate support to electrically bias the substrate support.

13. The process chamber according to claim 12, further comprising a magnetron disposed above the target, wherein the magnetron is configured to form an annular plasma in the peripheral portion of the interior volume.

14. The process chamber according to claim 13, further comprising a controller configured to control the magnetron to form the annular plasma, the first power source and the second power source to respectively bias the target and the substrate support relative to each other to maintain the annular plasma formed over the collimator and, while maintaining the annular plasma over the collimator, controlling the collimator power source to bias the collimator to control a ratio of ions and neutrals of sputter material through the collimator, the first magnet to guide the ions through the collimator, and the second magnet to guide the ions toward a center of the support surface.

15. The process chamber according to claim 9, wherein the magnetic field generated by the second magnet has magnetic field lines directed toward a center of the support surface.

16. The process chamber according to claim 9, wherein the third magnet is entirely disposed below the collimator.

17. The process chamber according to claim 16, wherein the third magnet is entirely disposed above the second magnet.

18. The process chamber according to claim 9, wherein the first magnet is disposed above a substrate-facing surface of the collimator.

19. The process chamber according to claim 9, wherein at least one of the first magnet, the second magnet, or the third magnet is moveable in a direction parallel to a central axis of the process chamber.

20. A process chamber for processing a substrate, comprising:
a body having an interior volume and a target to be sputtered, wherein the interior volume includes a central portion and a peripheral portion surrounding the central portion;
a substrate support disposed in the interior volume opposite the target and having a support surface configured to support the substrates, the substrate support having a raised position;
a collimator disposed in the interior volume between the target and the substrate support;
a first electromagnet disposed about the body disposed above a lower face of the collimator and configured to generate a magnetic field having substantially vertical magnetic field lines in the peripheral portion of the interior volume;
a second electromagnet disposed about the body above the support surface of the substrate support and entirely below the collimator and spaced vertically below the first electromagnet, wherein the second electromagnet is configured to generate a magnetic field having magnetic field lines directed toward a center of the support surface, wherein the second electromagnet is disposed about the body above the support surface of the substrate support when the substrate support is in the raised position; and
a third electromagnet disposed about the body and spaced vertically between the first electromagnet and the second electromagnet and above the second electromagnet and below a substrate-facing surface of the collimator, wherein the third electromagnet is configured to generate a magnetic field having magnetic field lines directed inward and downward toward the central portion and toward the center of the support surface.

* * * * *